United States Patent
Nguyen et al.

(10) Patent No.: US 6,221,166 B1
(45) Date of Patent: Apr. 24, 2001

(54) MULTI-THERMAL ZONE SHIELDING APPARATUS

(75) Inventors: Tue Nguyen, Fremont; Craig Alan Bercaw, Los Gatos, both of CA (US)

(73) Assignee: Simplus Systems Corporation, Fremont, CA (US)

( * ) Notice: Subject to any disclaimer, the term of this patent is extended or adjusted under 35 U.S.C. 154(b) by 0 days.

(21) Appl. No.: 09/589,625

(22) Filed: Jun. 7, 2000

(51) Int. Cl.[7] .................................................. C23C 16/00
(52) U.S. Cl. ................................................................ 118/725
(58) Field of Search ........................... 118/725, 729, 118/724, 720, 721

(56) References Cited

U.S. PATENT DOCUMENTS

| | | |
|---|---|---|
| 4,932,358 | 6/1990 | Studley et al. . |
| 5,304,248 | 4/1994 | Cheng et al. . |
| 5,965,047 * | 10/1999 | Blersch et al. .................. 219/390 |
| 5,991,508 * | 11/1999 | Ohmine et al. .................. 392/418 |
| 6,036,782 * | 3/2000 | Tanaka et al. .................. 118/715 |
| 6,069,135 * | 10/1999 | Guo et al. .......................... 118/729 |

* cited by examiner

Primary Examiner—Richard Bueker
Assistant Examiner—Erin Fieler

(57) ABSTRACT

A multi-thermal zone shielding apparatus provides a multi-zone temperature profile for the shield while shielding a portion of a hot workpiece in a high temperature processing system. The apparatus keeps the workpiece temperature hot at the shielded area and maintaining the rest of the shield cooler. The apparatus comprises a multi-thermal zone shield having a low thermal transmitivity section for preventing the heat lost of the shielded portion of the hot workpiece due to less thermal energy transmitting through the shielding portion of the shield, thus maintaining a more uniform temperature at the shielded portion of the workpiece, and a high thermal transmitivity section in the rest of shield for allowing more thermal energy from the hot workpiece transmitting through the shield without heating the shield, thus maintaining a cooler temperature at the portion of the shield not engaged with the workpiece. In a preferred embodiment, the invention further includes a non-reactive gas inlet for creating a pressurized cavity in the vicinity of the shielded portion of the workpiece.

11 Claims, 5 Drawing Sheets

MULTI-THERMAL ZONE SHIELDING APPARATUS

FIELD OF THE INVENTION

The present invention relates generally to apparatus for processing of a semiconductor wafer, and more particularly to an edge exclusion apparatus employing a multi-thermal zone shield to provide a multi-zone temperature profile for the shield while shielding a portion of a hot workpiece in a high temperature processing system.

BACKGROUND OF THE INVENTION

During the deposition of materials on a semiconductor wafer, it is desirable to exclude the materials from depositing on the edge of the front surface, the end edges and the backside of the wafer. This is important when the wafer requires surface treatment to improve the adhesion of the deposited material as in the case of tungsten deposition. The wafer surface needs to be coated with a adhesion promoter material such as titanium tungsten (TiW), or titanium nitride (TiN) before the deposition of tungsten to ensure proper adhesion. When tungsten is deposited on the front edge, end edges or backside of the wafer where there is no TiW or TiN, the deposited tungsten does not adhere properly and flakes off as particles. The generation of particles such as these could be damaging to subsequent wafer processing. Edge and backside exclusion is also of particular importance when the deposited materials requires a diffusion barrier layer to prevent the deposited materials from reaching the silicon wafer, creating device degradation. For example, copper is deposited on a diffusion barrier layer such as TiN, tantalum nitride, tungsten nitride. Without the diffusion barrier layer, copper could migrate to the silicon area and degrade the device performance. Deposition of copper on the backside, end edges and front edge where there is no diffusion barrier material severely affects the device properties.

FIG. 1 shows a prior art edge exclusion apparatus employing purging gas to prevent edge and backside deposition. Deposition precursor enters the inlet 20, and deposits on the wafer 10. The inlet 20 could be a showerhead, providing precursor flow 16 to the wafer 10 at a more uniform distribution. Purging gas 15 enters the gap between the wafer holder 30 and the blocker 24 to prevent material deposition at the wafer 10 edge and backside. Precursor flow 16 ff continues to 26 and purging gas 15 continues to 25 to reach the exhaust. The major drawback of this prior art apparatus is the high purging gas required to prevent edge and backside deposition, typically in the range of liter per minute flow. Therefore this apparatus is not suitable for system using low precursor flow.

Another prior art apparatus is U.S. Pat. No. 4,932,358 of Studley et al. Studley et al. disclosed a seal ring which presses down against a wafer on a CVD chuck continuously around the outer periphery of the wafer, and with sufficient force to hold the backside of the wafer against the chuck. This apparatus requires a complicated mounting mechanism to move the seal ring in and out of clamping engagement with the wafer and to maintain alignment between the seal ring and the wafer. Furthermore, the seal ring can only be as wide as the diameter of the chuck.

FIG. 2 shows a prior art apparatus from U.S. Pat. No. 5,851,299 of Cheng et al. Cheng et al. disclosed a shield ring 50 normally rests on a ring support 72. The shield ring 50 engages the front side edge of the wafer 10 when the wafer support 40 is raised into the contact position by the susceptor lift 46. The wafer edge and backside is shielded from the precursor flow from the showerhead 20. Cheng et al. also disclosed an additional purging gas flow 1 retained in the cavity between the wafer support 40, the wafer 10 and the shield ring 50. The purging gas exhausts through the gap 2 between the ring support 72 and the shield ring 50, and combines with the precursor exhaust 3 to reach the vacuum pump.

As with the other prior art, the major drawback of this shield ring is that eventually there will be some deposition at the edge of the shield ring at the locations where the shield ring contacts the wafer. This gap between the shield ring and the wafer caused by material deposit will be widen quickly with time due to more and more material deposition. This process causes the shield ring to lose contact with the wafer and thus no longer perform the shielding action. The apparatus will need to shut down, the chamber vented, and the shield ring manually replaced. Then the chamber will be pump down and the system needs conditioning for process qualification before running again. This causes a significant lost in productivity.

The purging gas is helpful in reducing the built up of material deposit at the shield ring edge. However in prior art Cheng et al. apparatus, as seen in FIG. 2, the purging gas escapes easily through the big gap between the shield ring 50 and the ring support 72. In Cheng et al. apparatus, this gap is required for proper shielding of the wafer. The minimum gap size is probably 0.1" to allow adequate separation between the shield ring and the wafer for the removal of the wafer. Assuming a 10" diameter for the shield ring for the processing of a 8" wafer, the purging gas area is 0.1×10, translated into an equivalent diameter D of 1.1". The 1.1" diameter opening would requires a very high flow rate to retain the purging gas at the connection of the wafer and the shield ring to prevent material deposition there, especially when the typical inlet of the purging gas is only 0.25" in diameter.

One major draw back of the prior art apparatus is the uniform temperature profile of the shield ring in high temperature processing systems. In these systems, the wafer is heated for the process reaction to take place, but it is desirable to have the shield ring cooler than the wafer to prevent reaction at the shield ring. Using high thermal conductivity material will raise the temperature of the shield ring through the transfer of thermal energy from the heated wafer. Using low thermal conductivity material will lower the temperature of the shield ring, but the wafer temperature will no longer be uniform because of the heat loss at the contact area with the cool shield ring. Using a high thermal reflectivity material will solve the problem because all the heat will be reflected back, and the shield will be cool without draining the thermal energy from the wafer edge. However, there is currently no effective high thermal reflectivity material available.

It would be advantageous to develop a shielding apparatus that has variable temperature profile.

It would be advantageous to develop a shielding apparatus that do not cause the heat loss at the wafer edge.

It would be advantageous to develop a shielding apparatus that reduces the down time of the system.

It would be advantageous to develop an apparatus with smaller purging gas escape flow.

SUMMARY OF THE INVENTION

Accordingly, a multi-thermal zone shielding apparatus is provided. The apparatus includes a shield with multiple zones having different thermal property. In the shield area to be in contact with the workpiece for shielding purpose, the shield material has low heat transmitivity property to retain heat in the workpiece. In the rest of the shield area, the shield material has high heat transmitivity property to prevent the shield from absorbing the heat.

The multi-thermal zone shielding apparatus for shielding a portion of a hot workpiece in a high temperature processing system while keeping the workpiece temperature hot at the shielded area and maintaining the rest of the shield cooler comprises:

a) a heater means for heating the workpiece within the system;

b) a multi-thermal zone shield for engaging a portion of the workpiece and shielding the engaged portion of the workpiece during processing thereof to prevent processing on the engaged portion of the workpiece, the multithermal zone shield comprising a low thermal transmitivity section in the portion of the shield to be engaged and shielding the workpiece, the low transmitivity section preventing the heat lost of the shielded portion of the hot workpiece due to less thermal energy transmitting through the shielding portion of the shield, thus maintaining a more uniform temperature at the shielded portion of the workpiece;

a high thermal transmitivity section in the rest of shield, the portion of the shield not engaged with the workpiece having high thermal transmitivity to allow more thermal energy from the heater means and from the hot workpiece transmitting through the shield without heating the shield, thus maintaining a cooler temperature at the portion of the shield not engaged with the workpiece;

c) a moving means for engaging the shield with the portion of the workpiece.

In some aspects of the invention, the thermal transmitivity property is equivalent to light transmitivity as in the case of infrared heating.

In some aspects of the invention, the shield is made of transparent material, and the low thermal transmitivity section of the shield is processed to achieve an opaque property.

In some aspects of the invention, the low thermal transmitivity section of the shield is made of opaque material and the high thermal transmitivity section of the shield is made of transparent material.

In some aspects of the invention, the shield is made of quartz or glass material, and the low thermal transmitivity section of the shield is processed to become opaque and the high thermal transmitivity section of the shield is processed to become transparent.

In some aspects of the invention, the heater means comprises a heated workpiece support having a heated top surface for supporting and heating the workpiece. In some aspects of the invention, the moving means for engaging the shield with the portion of the workpiece comprises a movable shaft connected to the heated workpiece support. In some aspects of the invention, the movable shaft consists of a shaft connected to a linear guide for allowing the shaft to travel a straight line. An air cylinder or a motor, such as a stepper motor or a servo motor, could serve to power the movable shaft.

In some aspects of the invention, the heater means comprises a lamp heater for heating the workpiece and the apparatus further comprises a non-heated workpiece support for supporting the workpiece. In some aspects of the invention, the moving means for engaging the shield with the portion of the workpiece comprises a movable shaft connected to the non-heated workpiece support.

In some aspects of the invention, the heated workpiece support comprises a taper outer edge and the shield comprises a taper inner edge of similar angle, whereby the shield maybe moved into alignment with the workpiece support in the engaged position.

The present invention further provides a shield support means for supporting the shield so that the shield and the workpiece are spaced apart when the workpiece support moving means disengages the workpiece from the shield. The shield support separates the shield from the workpiece in the disengaged position so that the workpiece can be replaced without disturbing the shield.

In a preferred embodiment for vacuum applications, the multi-thermal zone shielding apparatus for shielding a portion of a hot workpiece in a high temperature processing system while keeping the workpiece temperature hot at the shielded area and maintaining the rest of the shield cooler comprises:

a) a heated workpiece support for heating and supporting the workpiece within the system;

b) a multi-thermal zone shield for engaging a portion of the workpiece and shielding the engaged portion of the workpiece during processing thereof to prevent processing on the engaged portion of the workpiece, the multi-thermal zone shield comprising a low thermal transmitivity section in the portion of the shield to be engaged and shielding the workpiece, the low transmitivity section preventing the heat lost of the shielded portion of the hot workpiece due to less thermal energy transmitting through the shielding portion of the shield, thus maintaining a more uniform temperature at the shielded portion of the workpiece;

a high thermal transmitivity section in the rest of shield, the portion of the shield not engaged with the workpiece having high thermal transmitivity to allow more thermal energy from the heater means and from the hot workpiece transmitting through the shield without heating the shield, thus maintaining a cooler temperature at the portion of the shield not engaged with the workpiece;

c) a moving means for engaging the shield with the portion of the workpiece;

e) a non-reactive gas inlet for providing a non-reactive gas to a cavity defined by the heated workpiece support, the workpiece, and the shield, the cavity retaining the non-reactive gas in the vicinity of the shielded portion of the workpiece.

The additional non-reactive gas inlet supplies a higher pressure in the cavity defined by the workpiece support, the workpiece, the shield and the shield restraint clamp than the pressure in the processing system, thus provides further assurance that the depositing material will not deposit at the edge and backside of the workpiece.

In some aspects of the invention, the shield stays close to the workpiece support so that the cavity retaining the non-reactive gas has no large leak when the workpiece support moving means engages the workpiece with the shield. To maintain high differential pressure between the cavity and the chamber pressure, the cavity needs to not having large leakage. In some aspects of the invention, the shield rests on the workpiece support when the moving means engages the workpiece with the shield to maintain small leakage inside the cavity.

In some aspects of the invention, the workpiece is a semiconductor wafer, top surface of the workpiece support is circular, and the cavity retains the nonreactive in the vicinity of the circumferencial edge of the semiconductor wafer.

In another preferred embodiment of the invention, the apparatus provides a replacement means for the shielding plate without significant system down time. The apparatus provides a replaceable multi-thermal zone workpiece shielding plate for engaging a portion of the workpiece and shielding the engaged portion of the workpiece during processing thereof to prevent processing on the engaged portion of the workpiece in a high temperature processing system. The apparatus keeping the workpiece temperature hot at the shielded area and maintaining the rest of the shield cooler. The apparatus comprises:

a) a replaceable shield of comparable weight as the workpiece for allowing replacement of the shield in the same way as the replacement of the workpiece;

a) a low thermal transmitivity section in the portion of the shield to be engaged and shielding the workpiece, the low transmitivity section preventing the heat lost of the shielded portion of the hot workpiece due to less thermal energy transmitting through the shielding portion of the shield, thus maintaining a more uniform temperature at the shielded portion of the workpiece;

b) a high thermal transmitivity section in the rest of shield, the portion of the shield not engaged with the workpiece having high thermal transmitivity to allow more thermal energy from the heater means and from the hot workpiece transmitting through the shield without heating the shield, thus maintaining a cooler temperature at the portion of the shield not engaged with the workpiece.

The replaceable shield has been disclosed in a co-application titled "Replaceable shielding apparatus" of the same author, Tue Nguyen. The apparatus includes a replaceable shield of comparable weight as the wafer, thus allowing the replacement of the shield in the same way as the replacement of the wafer. With this replaceable shielding apparatus, the system no longer needs to be shut down for shield replacement. The shield replacement can be performed at every wafer, or at every 25 wafers, or one a day, or one a week, depend on the degradation of the shield ring due to material deposited at the shield ring edge. The present invention further comprises multi-thermal zone sections to maintain better temperature profile in the shield, thus offering better process performance.

DETAIL DESCRIPTION OF THE PREFERRED EMBODIMENT

Figure 1:
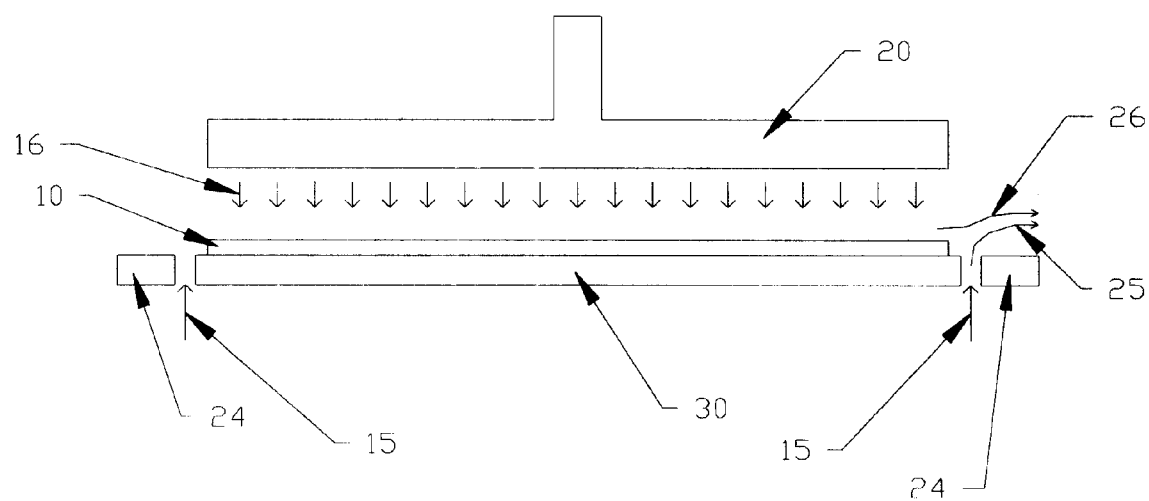
FIG. 1 shows a prior art edge exclusion apparatus.
Figure 2:
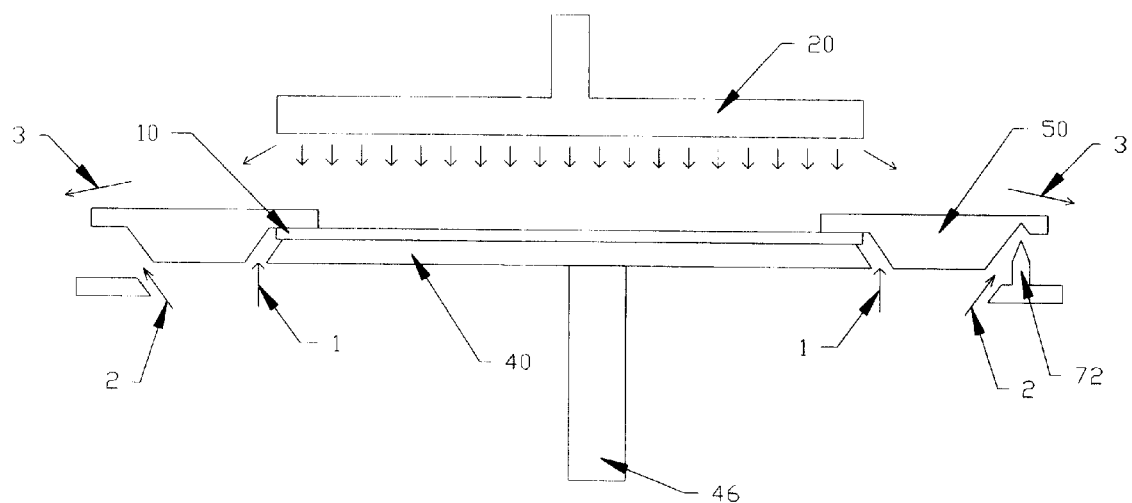
FIG. 2 shows another prior art edge exclusion apparatus.
Figure 3:
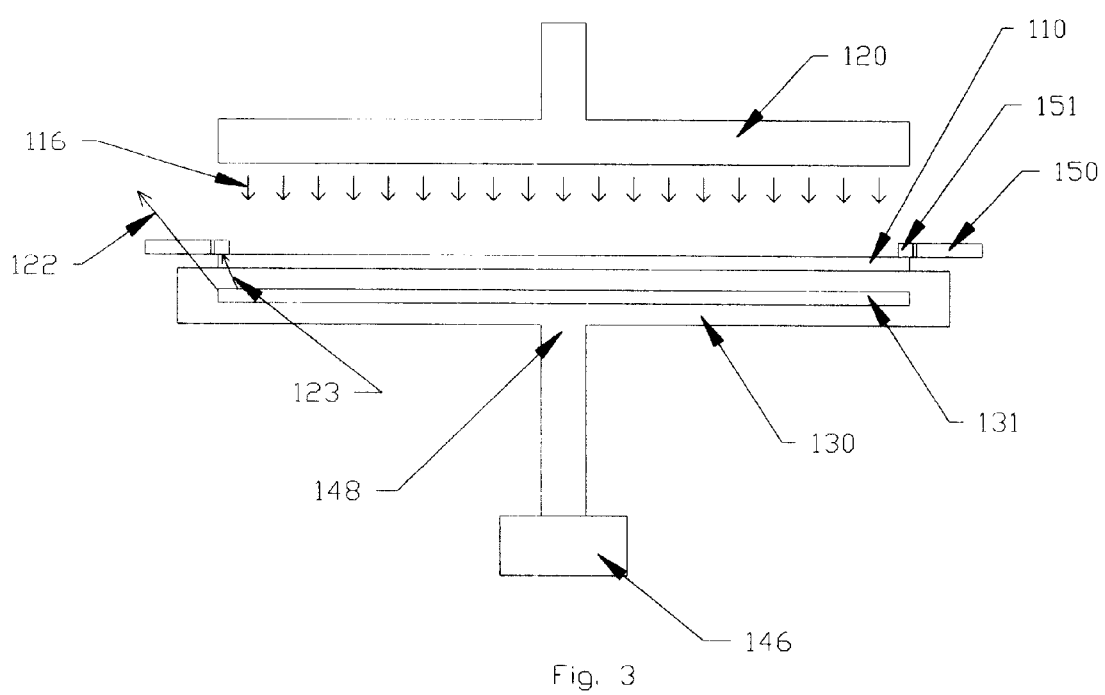
FIG. 3 shows the present invention of the multi-thermal zone shielding apparatus in the engaged position.

FIG. 3 shows the present invention of the multi-thermal zone shielding apparatus in the engaged position. The workpiece 110 is heated by the heater 131. In some aspects of the invention, the heater 131 is embedded in the workpiece support 130. The workpiece support 130 is connected to a moving means 148. In some aspects of the invention, the moving means 148 is a shaft connected to a susceptor lift 146. The susceptor lift 146 moves the shaft 148, and thus moves the workpiece support 130 between the disengaged and engaged position. The multi-thermal zone shield 150 and 151 comprises two sections, a low transmitivity section 151 and a high transmitivity section 150. The shield 150/151 in the engaged position shields a portion of the workpiece 110 to prevent deposition at the workpiece edge and backside from the showerhead 120 having precursor flow 116. The high transmitivity section 150 allows the thermal energy from the heater 131 to pass through 122 the shield section 150, thus the shield section 150 does not absorb much heat from the heated 131 to raise its temperature appreciably. The low transmitivity section 151 allows little heat loss through the shield 151. Much heat will be absorbed to the shield section 151, thus raising the temperature of the shield section 151 and in turn keeping the edge of the wafer 110 at the same temperature as before. The heat supplied to the shield section will come from the heater 131. Using low thermal conductivity material will further accomplish a temperature gradient in the two sections, a high temperature section 151 and a low temperature section 150.

Figure 4:
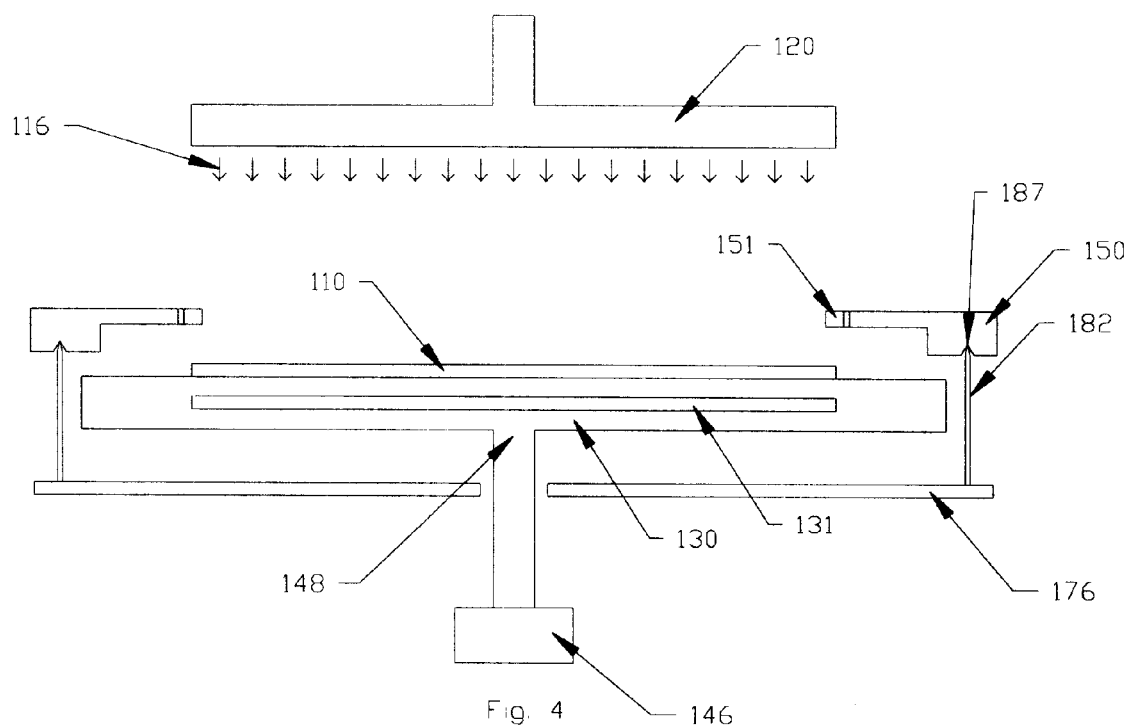
FIG. 4 shows the present invention of the multi-thermal zone shielding apparatus in the disengaged position.

FIG. 4 shows the present invention of the multi-thermal zone shielding apparatus in the disengaged position. The susceptor lift 146 moves the shaft 148 and the workpiece support 130, leaving the multi-thermal zone shield 150/151 in the disengaged position. The shield support 172 separates the shield 150/151 from the workpiece 110 to allow the removal of the workpiece 110. The shield support 172 is connected to a stationary wall 176 such as the chamber wall.

Figure 5:
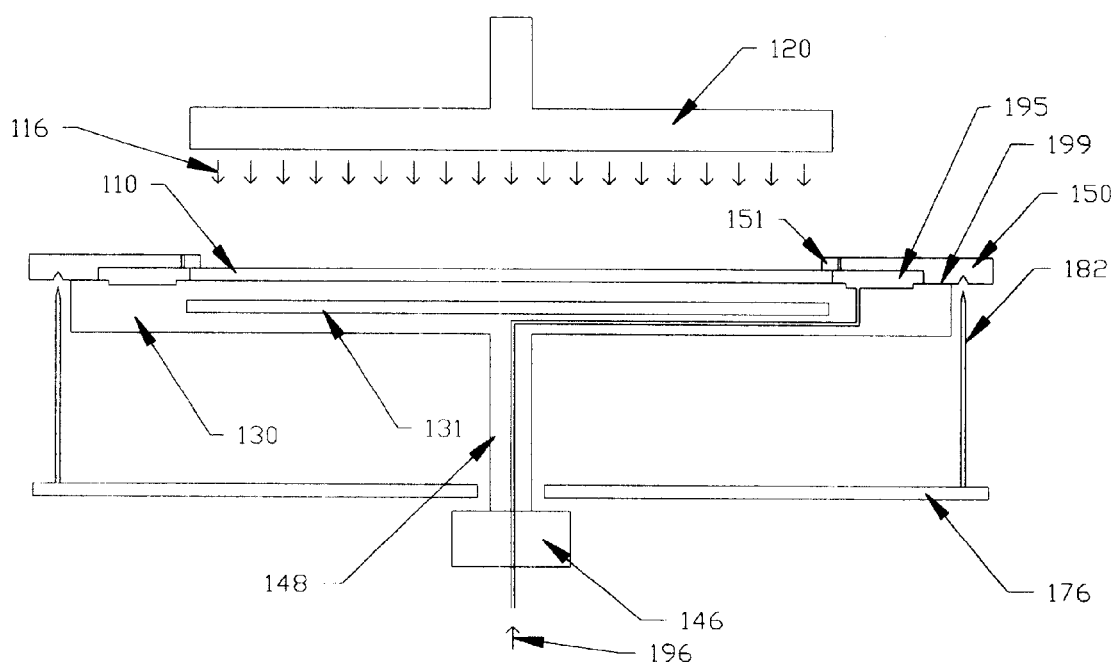
FIG. 5 shows the present invention of the multi-thermal zone shielding apparatus in the engaged position with the purging gas.

FIG. 5 shows the present invention of the multi-thermal zone shielding apparatus in the engaged position with the purging gas. The purging gas 196 enters from outside the system to the cavity 195 defined by the workpiece support 130, the workpiece 110, and the shield 150/151. The shield 150/151 is resting on the workpiece support 130 at location 199, therefore the purging gas leakage should be minimum. The cavity 195 retains the purging gas, creates a higher pressure in the cavity 195 than in the chamber, therefore further preventing the deposition at the shielding portion of the workpiece.

What is claimed is:

1. A replaceable multi-thermal zone workpiece shielding plate apparatus for engaging a portion of the workpiece and shielding the engaged portion of the workpiece during processing thereof to prevent processing on the engaged portion of the workpiece in a high temperature processing system, the apparatus keeping the workpiece temperature hot at the shielded area and maintaining the rest of the shield cooler, the apparatus comprising:

a) a replaceable shield of comparable weight as the workpiece for allowing replacement of the shield in the same way as the replacement of the workpiece;

a) a low thermal transmitivity section in the portion of the shield to be engaged and shielding the workpiece, the low transmitivity section preventing the heat lost of the shielded portion of the hot workpiece due to less thermal energy transmitting through the shielding portion of the shield, thus maintaining a more uniform temperature at the shielded portion of the workpiece;

b) a high thermal transmitivity section in the rest of shield, the portion of the shield not engaged with the workpiece having high thermal transmitivity to allow more thermal energy from the heater means and from the hot workpiece transmitting through the shield without heating the shield, thus maintaining a cooler temperature at the portion of the shield not engaged with the workpiece.

2. An apparatus in claim 1 in which the shied is made of transparent material, and the low thermal transmitivity section of the shield is processed to achieve an opaque property.

3. An apparatus in claim 1 in which the low thermal transmitivity section of the shield is made of opaque material and the high thermal transmitivity section of the shield is made of transparent material.

4. An apparatus as in clam 1 in which the shield is made of quartz or glass material, and the low thermal transmitivity section of the shield is processed to become opaque and the high thermal transmitivity section of the shield is processed to become transparent.

5. An apparatus as in claim 1 further comprising a shield support to support the shield so that the shield and the workpiece are spaced apart when the workpiece is disengaged from the shield.

6. An apparatus as in claim 5 further comprising a shield aligner connected to the shield and the shield support for aligning the shield with the shield support.

7. An apparatus as in claim 1 further comprising a movable shaft connected to a workpiece support.

8. An apparatus as in claim 1, further comprising a heater for heating a workpiece within the system.

9. An apparatus as in claim 8 in which the heater further comprises a heated workpiece support having a heated top surface for supporting and heating the workpiece.

10. An apparatus as in claim 8 in which the heater comprises a lamp heater for heating the workpiece and the apparatus further comprises a non-heated workpiece support for supporting the workpiece.

11. An apparatus as in claim 9 in which the heated workpiece support comprises a taper outer edge and the shield comprises a taper inner edge of similar angle, whereby the shield maybe moved into alignment with the workpiece support in the engaged position.

* * * * *